(12) United States Patent
Hui et al.

(10) Patent No.: US 7,972,951 B2
(45) Date of Patent: *Jul. 5, 2011

(54) MEMORY DEVICE ETCH METHODS

(75) Inventors: Angela T. Hui, Fremont, CA (US);
Jihwan Choi, San Mateo, CA (US)

(73) Assignees: Advanced Micro Devices, Inc.,
Sunnyvale, CA (US); Spansion LLC,
Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/688,477

(22) Filed: Jan. 15, 2010

(65) Prior Publication Data

US 2010/0120239 A1    May 13, 2010

Related U.S. Application Data

(63) Continuation of application No. 11/616,085, filed on Dec. 26, 2006, now Pat. No. 7,670,959.

(51) Int. Cl.
*H01L 21/3205* (2006.01)
*H01L 21/4763* (2006.01)

(52) U.S. Cl. .................. 438/591; 257/E21.18
(58) Field of Classification Search .................. 438/591, 438/714; 257/E21.18
See application file for complete search history.

(56) References Cited

U.S. PATENT DOCUMENTS

| 6,254,966 B1 | 7/2001 | Kondo |
| 6,337,285 B1 | 1/2002 | Ko |
| 6,518,103 B1 | 2/2003 | Lai |
| 7,037,850 B2 | 5/2006 | Lee et al. |
| 7,670,959 B2 * | 3/2010 | Hui et al. ............... 438/714 |

OTHER PUBLICATIONS

Co-pending U.S. Appl. No. 11/616,085, filed Dec. 26, 2006; Angela T. Hui et al., entitled "Memory Device Etch Methods".
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.
Xuejue Huang et al., "Sub-50 nm P-Channel FinFET," IEEE Transactions on Electron Devices, vol. 48, No. 5, May 2001, pp. 880-886.
Yang-Kyu Choi et al., "Sub-20nm CMOS FinFET Technologies," 2001 IEEE, IEDM, pp. 421-424.
Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

* cited by examiner

*Primary Examiner* — Matthew W Such
*Assistant Examiner* — Monica D Harrison
(74) *Attorney, Agent, or Firm* — Harrity & Harrity, LLP

(57) ABSTRACT

A method of manufacturing a memory device forms a first dielectric layer over a substrate, forms a charge storage layer over the first dielectric layer, forms a second dielectric layer over the charge storage layer, and forms a control gate layer over the second dielectric layer. The method also forms a hard mask layer over the control gate layer, forms a bottom antireflective coating (BARC) layer over the hard mask layer, and provides an etch chemistry that includes tetrafluoromethane ($CF_4$) and trifluoromethane ($CHF_3$) to etch at least the control gate layer.

17 Claims, 18 Drawing Sheets

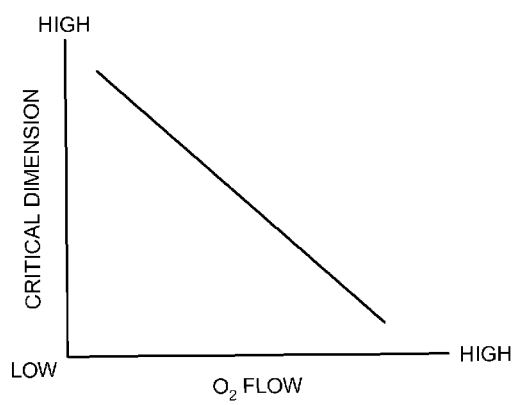
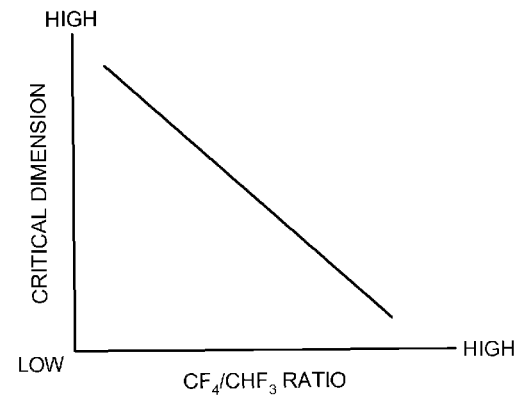
FIG. 3A  FIG. 3B

MEMORY DEVICE ETCH METHODS

RELATED APPLICATION

This application is a continuation of U.S. patent application Ser. No. 11/616,085, filed Dec. 26, 2006, which is incorporated herein by reference.

BACKGROUND

1. Field of the Invention

Implementations described herein relate generally to methods of manufacturing semiconductor devices, and, more particularly, to etch methods for memory devices.

2. Description of Related Art

The escalating demands for high density and performance associated with non-volatile memory devices require small design features, high reliability, and increased manufacturing throughput. The reduction of design features below a critical dimension (CD) challenges the limitations of conventional methodologies. The critical dimension of a semiconductor device design feature may be the length or width of that feature.

For example, etch methods may be used to form design features on memory devices. Typically, photoresist layers are patterned to define the design feature on the material to be etched. The photoresist layer may act as a mask to protect the portion of the material underlying the photoresist while leaving exposed the portion of the material to be etched. However, as the size and geometry of design features decrease, conventional photoresist materials become too thin to sustain resistance to the etch plasma during the etching process. This results in over-etching and improper formation of a design feature.

SUMMARY

According to one aspect, a method of manufacturing a memory device may include forming a first dielectric layer over a substrate, forming a charge storage layer over the first dielectric layer, forming a second dielectric layer over the charge storage layer, and forming a control gate layer over the second dielectric layer. The method may also include forming a hard mask layer over the control gate layer, forming a bottom anti-reflective coating (BARC) layer over the hard mask layer, and providing an etch chemistry comprising tetrafluoromethane ($CF_4$), trifluoromethane ($CHF_3$), and oxygen ($O_2$) to etch at least the control gate layer.

According to another aspect, a method of manufacturing a memory device may include forming a first dielectric layer over a substrate, forming a charge storage layer over the first dielectric layer, forming a second dielectric layer over the charge storage layer, forming a control gate layer over the second dielectric layer, forming a hard mask layer over the control gate layer, and forming a bottom anti-reflective coating (BARC) layer over the hard mask layer. The method may also include performing an etch process to etch at least the control gate layer. The etch process may include an etch chemistry having tetrafluoromethane ($CF_4$), trifluoromethane ($CHF_3$), and at least one of octafluorocyclobutane ($C_4F_8$), hexafluorobutadiene ($C_4F_6$), or octafluorocyclopentene ($C_5F_8$).

According to still another aspect, a method of etching layers of a memory device may include providing an etch chemistry to etch the layers. The etch chemistry may include tetrafluoromethane ($CF_4$) and trifluoromethane ($CHF_3$) at a flow rate ratio ranging from about 70:30 to about 100:0, and oxygen ($O_2$) at a flow rate ranging from about 0 sccm to about 50 sccm.

According to a further aspect, a method of etching layers of a memory device may include providing an etch chemistry to etch the layers. The etch chemistry may include tetrafluoromethane ($CF_4$) and trifluoromethane ($CHF_3$) at a flow rate ratio ranging from about 70:30 to about 100:0, and at least one of octafluorocyclobutane ($C_4F_8$), hexafluorobutadiene ($C_4F_6$), or octafluorocyclopentene ($C_5F_8$) at a flow rate ranging from about 0 sccm to about 20 sccm.

BRIEF DESCRIPTION OF THE DRAWINGS

The accompanying drawings, which are incorporated in and constitute a part of this specification, illustrate an embodiment of the invention and, together with the description, explain the invention. In the drawings:

FIGS. 3A and 3B are graphs showing exemplary conditions associated with the hard mask etching method used in FIG. 2;

DETAILED DESCRIPTION

The following detailed description of the invention refers to the accompanying drawings. The same reference numbers in different drawings may identify the same or similar elements. Also, the following detailed description does not limit the invention.

Implementations consistent with principles of the invention may relate to hard mask etch methods that provide critical dimensions for memory cells used in memory devices. By using a hard mask and adjusting the etch chemistry and flow rates, memory cells with small critical dimensions may be fabricated. The hard mask etching methods may also provide for improved control over the small critical dimensions of the memory cells. For example, in one implementation, the hard mask etch methods may be used to fabricate memory cells having critical dimensions, such as critical dimensions 65 and/or 45 nanometers (nm), and lower. The hard mask and adjusted etch chemistry and flow rates may eliminate the problems associated with conventional photoresist material etch methods.

"Critical dimension," as the term is used herein, is to be broadly interpreted to include the width, length, and/or other dimension of a semiconductor device design feature deemed to be important.

Exemplary Memory Devices

Figure 1:
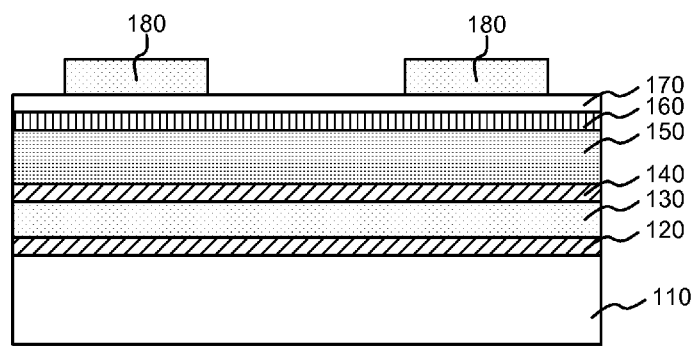
FIG. 1 is a cross-section of exemplary layers used to form memory cells according to implementations consistent with principles of the invention.

FIG. 1 illustrates a cross-section of a semiconductor device 100 formed in accordance with implementations consistent with principles of the invention. As shown in FIG. 1, semiconductor device 100 may include layers 110, 120, 130, 140, 150, 160, and 170. In one implementation, layer 110 may be a substrate of semiconductor device 100 and may include silicon, germanium, silicon-germanium or other semiconducting materials. In another implementation, layer 110 may be a conductive layer or a dielectric layer formed a number of layers above the surface of a substrate in semiconductor device 100.

Layer 120 may be a dielectric layer formed on layer 110 in a conventional manner. In one implementation, dielectric layer 120 may include an oxide, such as a silicon oxide (e.g., $SiO_2$), and may have a thickness ranging from, for example, about 30 angstroms (Å) to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, in one implementation, may act as a charge storage layer for semiconductor device 100 and may have a thickness ranging from, for example, about 40 Å to about 100 Å. In another implementation, layer 130 may include a conductive material, such as polycrystalline silicon, which may form a floating gate electrode. In this implementation, layer 130 may have a thickness ranging from about 500 Å to about 1,000 Å.

Layer 140 may be formed on layer 130 in a conventional manner and may include a dielectric material, such as an oxide (e.g., $SiO_2$). In one implementation, layer 140 may include another material having a high dielectric constant (K), such as aluminum oxide or hafnium oxide, which may be deposited or thermally grown on layer 130. In another implementation, layer 140 may be a composite that includes a number of dielectric layers or films. Layer 140 may have a thickness ranging from, for example, about 40 Å to about 100 Å and may function as an inter-gate dielectric for memory cells in semiconductor device 100.

Layer 150 may include a conductive material, e.g., polycrystalline silicon, formed on layer 140 in a conventional manner. In one implementation, layer 150 may include other semiconducting materials, such as germanium or silicon-germanium, or various metals, such as titanium or tungsten. Layer 150, in one implementation, may form one or more control gate electrodes for one or more memory cells in semiconductor device 100. In another implementation, layer 150 may have a thickness ranging from, for example, about 1,000 Å to about 2,000 Å.

Layer 160 may be a hard mask layer, and may be formed on layer 150 in a conventional manner. In one implementation, hard mask layer 160 may include a material (e.g., an oxide, nitride, or oxynitride of a metal or semiconductor; silicon oxynitride; or combinations of the aforementioned), and may have a thickness ranging from, for example, about 50 Å to about 1500 Å. Hard mask layer 160 may facilitate formation of one or more memory cells in semiconductor device 100, as described in more detail below.

Layer 170 may be a bottom anti-reflective coating (BARC) layer. BARC layer 170 may be deposited using, for example, a spin-on process and may function to reduce reflections during subsequent lithography used to form the memory cells. In one implementation, BARC layer 170 may include an organic BARC, such as Brewer ARC28 or RHEM AR19, and may be deposited to a thickness ranging from about 150 Å to about 600 Å.

A photoresist material may be patterned and etched to form masks 180 on the top surface of BARC layer 170, as illustrated in FIG. 1. In one implementation, the particular configuration of masks 180 may be based on the particular circuit requirements associated with the memory cell for semiconductor device 100. For example, the photoresist material may be patterned and trimmed to form masks (e.g., masks 180) designed to achieve very small critical dimensions associated with a subsequently formed memory cell.

Semiconductor device 100 may be etched using hard mask layer 160 and masks 180 and by adjusting the etch chemistry to achieve particular critical dimensions for each memory cell. In one implementation, the thickness of hard mask layer 160 may be used in a trim etching method to form memory devices that include very small critical dimensions (e.g., 45 nm or less). In another implementation, the thickness of hard mask layer 160 may be used in a gain etching method to form memory devices that include larger critical dimensions (e.g., 65 nm or more).

Hard Mask Trim Etching

Figure 2:
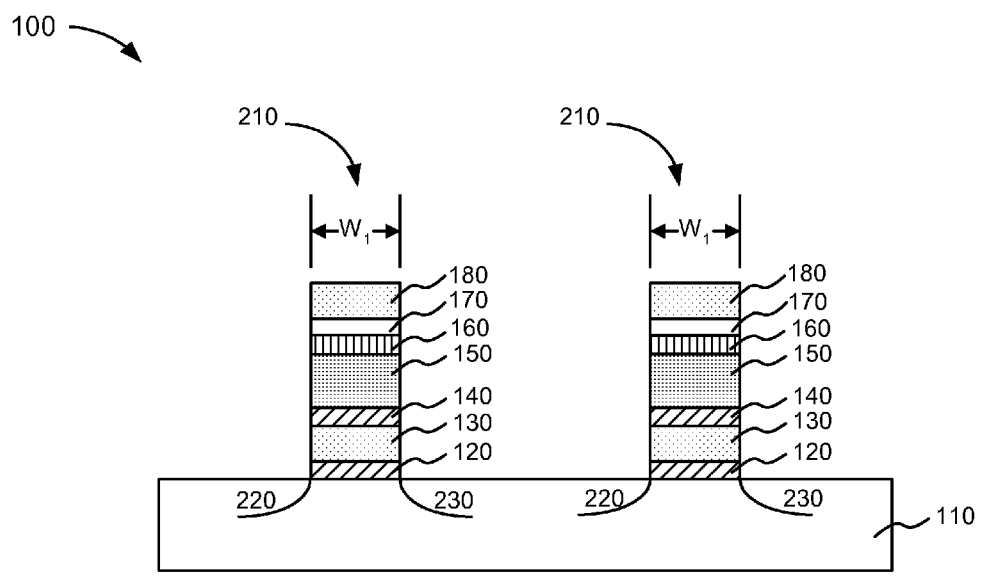
FIG. 2 is a cross-section illustrating the formation of memory cells with an exemplary hard mask etching method according to implementations consistent with principles of the invention.

FIG. 2 is a cross-section illustrating the formation of memory cells with a hard mask trim etching method. Referring to FIG. 2, layers 120-170 may be etched, and the etching may terminate at substrate 110 and form structures 210. Alternatively, the etching may terminate at another layer, e.g., layer 140, followed in one implementation by additional etching, to form structures 210. Each structure 210 (also referred to herein as memory cell 210) may represent a memory cell of semiconductor device 100. Each memory cell 210 may include a dielectric layer 120, a charge storage layer 130, an inter-gate dielectric layer 140, and a control gate electrode 150. Although only two memory cells 210 are illustrated in semiconductor device 100 of FIG. 2 for simplicity, semiconductor device 100 may include more or less memory cells 210. For example, semiconductor device 100 may include a memory array with a large number of memory cells 210.

The etch chemistry, particular flow rates, power ranges, bias voltages, etch duration, and other parameters associated with etching layers 120-170 may be adjusted based on the desired critical dimensions of memory cells 210. In one implementation consistent with principles of the present invention, the etch chemistry may include a combination of tetrafluoromethane ($CF_4$), trifluoromethane ($CHF_3$), octafluorocyclobutane ($C_4F_8$), argon (Ar), and oxygen ($O_2$). By adjusting the flow rate of tetrafluoromethane ($CF_4$) with respect to the flow rate of trifluoromethane ($CHF_3$) ("$CF_4$/$CHF_3$ ratio") and/or the flow rate of oxygen, the etch chemistry may etch memory cells 210 to the desired critical dimensions. For example, as shown in FIGS. 3A and 3B, the flow rate of oxygen may be decreased and/or the $CF_4$/$CHF_3$ ratio may be increased by increasing the flow rate of tetrafluoromethane ($CF_4$) with respect to the flow rate of $CHF_3$. The flow rate of oxygen and/or the flow rate of tetrafluoromethane ($CF_4$) may be greater than typically used to etch layers 120-170. The high oxygen and tetrafluoromethane ($CF_4$) flow rates may trim BARC layer 170, as well as layers 120-160, at a much faster etch rate than typically used to trim these layers.

In one implementation, for example, to create memory cells 210 having a critical dimension (e.g., a width $W_1$) ranging from about 25 nanometers to about 65 nanometers, oxygen may be provided in the etch process at a flow rate ranging from about 0 standard cubic centimeters per minute (sccm) to about 50 sccm. In one exemplary implementation, oxygen may be provided in the etch process at a flow rate ranging from about 0 sccm to about 50 sccm for a period ranging from about 50 seconds to about 20 seconds.

In addition, to create memory cells 210 having a critical dimension (e.g., a width $W_1$) ranging from about 25 nanometers to about 65 nanometers, the ratio of $CF_4$ to $CHF_3$ may range from about 70:30 to about 100:0. For example, tetrafluoromethane ($CF_4$) may be provided in the etch process with the other gases (e.g., $O_2$, $CHF_3$, $C_4F_8$, Ar) at a flow rate ranging from about 70 sccm to about 100 sccm. In one exemplary implementation, tetrafluoromethane ($CF_4$) may be provided in the etch process at a flow rate ranging from about 70 sccm to about 100 sccm for a period ranging from about 50 seconds to about 30 seconds.

In this implementation, trifluoromethane ($CHF_3$) may be provided in the etch process with the other gases (e.g., $O_2$, $CF_4$, $C_4F_8$, Ar) at a flow rate ranging from about 0 sccm to about 30 sccm. In one exemplary implementation, $CHF_3$ may be provided in the etch process at a flow rate ranging from about 0 sccm to about 30 sccm for a period ranging from about 30 seconds to about 50 seconds.

Using such flow rates may enable memory devices 210 shown in FIG. 2 to be formed with the desired dimensions (e.g. critical dimensions). The remaining flow rates (e.g., flow rates of $C_4F_8$ and Ar), power ranges, bias voltages, etch duration, and other parameters associated with etching layers 120-170 may be optimized based on the thickness of the various layers.

The flow rates discussed above with respect to $O_2$ are higher than the flow rates normally used to etch various dielectric and/or semiconductor layers. In addition, the ratio of $CF_4$ to $CHF_3$ is higher than that conventionally used to etch various dielectric and/or semiconductor layers. It has been found that using hard mask layer 160 and such flow rates/ratios results in formation of memory cells having smaller critical dimensions, as opposed to a conventional etch process using thin photoresist masks that do not sustain through the etch process for such geometries. It should be understood that the flow rates described above for etching layers 120-170 are exemplary only. Moreover, it should be understood that other gases or combination of gases, such as fluoromethane ($CH_3F$), or $HeO_2$, may be used to etch layers 120-170. In each case, the flow rates associated with various gases (e.g., $CF_4$ and $O_2$) may be higher than conventional flow ranges used to etch various dielectric and/or semiconductor layers. The high $CF_4$ and high $O_2$ flow may be used to erode photoresist masks 180 and BARC layer 170 to achieve the desired critical dimension trim effect.

Source and drain regions 220 and 230 may be formed in substrate 110, as illustrated in FIG. 2. For example, n-type or p-type impurities may be implanted in substrate 110 to form source and drain regions 220 and 230, based on the particular end device requirements. In one implementation, an n-type dopant, such as phosphorous or arsenic, may be implanted. In another implementation, a p-type dopant, such as boron, may be implanted. The particular implantation dosages and energy used to form source and drain regions 220 and 230 may be selected based on the particular end device requirements. Source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Hard Mask Gain Etching

Figure 4:
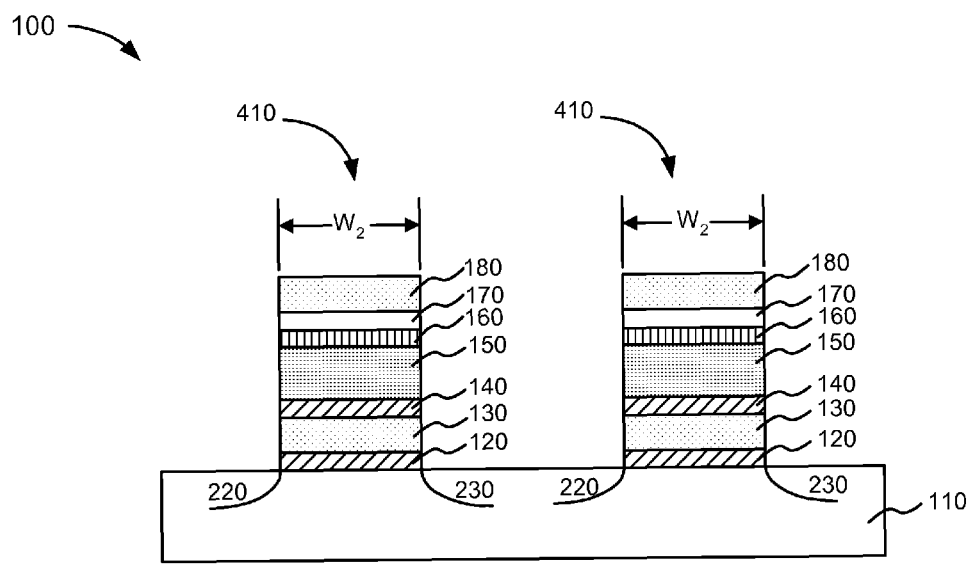
FIG. 4 is a cross-section illustrating the formation of memory cells with another exemplary hard mask etching method according to implementations consistent with principles of the invention.

FIG. 4 is a cross-section illustrating the formation of memory cells using a hard mask gain etching method. Referring to FIG. 4, layers 120-170 (shown in FIG. 1) may be etched, and the etching may terminate at substrate 110 to form structures 410. Alternatively, the etching may terminate at another layer, e.g., layer 140, followed in one implementation by additional etching, to form structures 410. Each structure 410 (also referred to herein as memory cell 410) may represent a memory cell of semiconductor device 100. Each memory cell 410 may include a dielectric layer 120, a charge storage layer 130, an inter-gate dielectric layer 140, and a control gate electrode 150. Although only two memory cells 410 are illustrated in semiconductor device 100 of FIG. 4 for simplicity, semiconductor device 100 may include more or less memory cells 410. For example, semiconductor device 100 may include a memory array with a large number of memory cells 410.

Figure 5A:
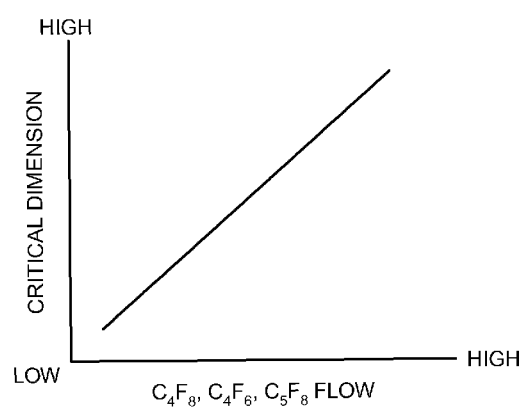
FIGS. 5A and 5B are graphs showing exemplary conditions associated with the hard mask etching method used in FIG. 4.
Figure 5B:
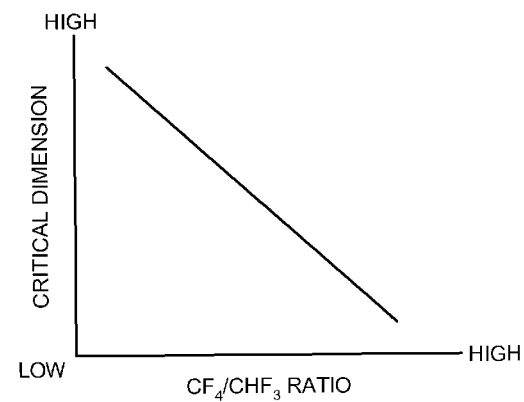

The etch chemistry, particular flow rates, power ranges, bias voltages, etch duration, and other parameters associated with etching layers 120-170 may be adjusted based on the desired critical dimensions of memory cells 410. In one implementation consistent with principles of the present invention, the etch chemistry may include a combination of $CF_4$, $CHF_3$, Ar, and a heavy polymerized component. By adjusting the $CF_4$/$CHF_3$ ratio and/or replacing the oxygen described above with respect to the hard mask trim etch method with a relatively high flow rate of a heavy polymerized component, the etch chemistry may etch memory cells 410 to the desired critical dimensions. In one implementation, the heavy polymerized component may include, e.g., octafluorocyclobutane ($C_4F_8$), hexafluorobutadiene ($C_4F_6$), octafluorocyclopentene ($C_5F_8$), and/or a combination of heavy polymerized components. For example, as shown in FIGS. 5A and 5B, the flow rate of the heavy polymerized component may be increased and/or the $CF_4$/$CHF_3$ ratio may be decreased by decreasing the flow rate of tetrafluoromethane ($CF_4$) to achieve the desired critical dimension.

In the implementation described above, the flow rate of the heavy polymerized component may be relatively high and the flow rate of $CF_4$ may be relatively low. The high heavy polymerized component flow rate may generate more polymer and provide a higher critical dimension gain for memory cells 410. The low $CF_4$ flow rate may decrease the $CF_4$/$CHF_3$ ratio. This decreased $CF_4$/$CHF_3$ ratio may minimize erosion of masks 180, which may minimize etching of layers below masks (e.g., layers 120-170). Such flow rate and etch chemistry adjustments may provide critical dimensions for memory cells 410 that may be larger than comparable critical dimensions of memory cells 210 fabricated with the trim etch method.

In one implementation, for example, to create memory cells 410 having a critical dimension (e.g., a width $W_2$) ranging from about 80 nanometers to about 150 nanometers, the heavy polymerized component (e.g., $C_4F_8$, $C_4F_6$, or $C_5F_8$) may be provided in the etch process at a flow rate ranging from about 0 sccm to about 20 sccm. In one exemplary implementation, the heavy polymerized component may be provided in the etch process at a flow rate ranging from about 0 sccm to about 20 sccm for a period ranging from about 25 seconds to about 60 seconds.

In addition, to create memory cells 410 having a critical dimension (e.g., a width $W_2$) ranging from about 60 nanometers to about 100 nanometers, the ratio of $CF_4$ to $CHF_3$ may range from about 100:0 to about 50:50. For example, the $CF_4$ may be provided in the etch process at a flow rate ranging from about 50 sccm to about 100 sccm. In one exemplary implementation, $CF_4$ may be provided in the etch process at a flow rate ranging from about 50 sccm to about 100 sccm for a period ranging from about 60 seconds to about 25 seconds. In this implementation, $CHF_3$ may be provided in the etch process at a flow rate ranging from about 0 sccm to about 50 sccm for a period ranging from about 25 seconds to about 60 seconds to achieve the desired $CF_4/CHF_3$ ratio.

Such flow rates and etch chemistry may provide memory devices 410 shown in FIG. 4. The remaining flow rates (e.g., Ar), power ranges, bias voltages, etch duration, and other parameters associated with etching layers 120-170 may be optimized based on the thickness of the various layers.

The flow rates and etch chemistry discussed above are different than the flow rates and etch chemistry normally used to etch layers 120-170. It has been found that using hard mask layer 160 and such flow rates and etch chemistry provides control over the critical dimensions of memory cells having smaller geometries, as opposed to a conventional etch process using thin photoresist masks that do not sustain through the etch process for such geometries. It should be understood that the flow rates and etch chemistry described above for etching layers 120-170 are exemplary only. Moreover, it should be understood that other gases or combination of gases, such as $CH_3F$, or difluoromethane ($CH_2F_2$), may be used to etch layers 120-170.

As further shown in FIG. 4, source and drain regions 220 and 230 may be formed in substrate 110 of semiconductor device 100 in a manner as described above in connection with FIG. 2.

Formation Of Additional Features Of Semiconductor Device

The remaining description of the formation of semiconductor device 100, as described in connection with FIGS. 6-13, will be provided with reference to memory cells 410 shown in FIG. 4, but may equally apply to memory cells 210 shown in FIG. 2. In an exemplary implementation consistent with the invention, each memory cell 210, 410 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110. In another implementation, each memory cell 210, 410 may be a floating gate memory cell, with a silicon control gate electrode 150, an inter-gate dielectric 140, a polysilicon floating gate electrode 130 and a tunnel oxide layer 120 formed on substrate 110.

Figure 6:
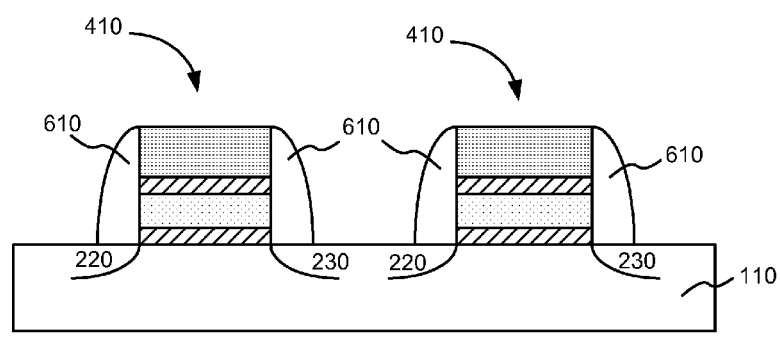
FIG. 6 is a cross-section illustrating the formation of spacers adjacent the side surfaces of the memory cells of FIG. 4.

After layers 120-170 have been etched, BACR 170 and the portions of hard mask 160 located below BARC 170 may be stripped with a conventional process, resulting in semiconductor device 100 shown in FIG. 6. Spacers 610 may be formed adjacent the sidewalls of the memory cells 410, as illustrated in FIG. 6. For example, a dielectric material (e.g., a silicon oxide, a silicon nitride, a silicon oxynitride or another dielectric material) may be deposited and etched to form spacers 610 on each side of memory cells 410, as shown in FIG. 6. Spacers 610 may electrically isolate adjacent memory cells 410 from each other. Spacers 610 may also be used to facilitate the deposition of impurities in semiconductor device 100.

A metal may optionally be deposited over semiconductor device 100, followed by an annealing to form a metal-silicide compound. For example, in one implementation, a metal (e.g., cobalt, titanium or nickel) may be deposited over the surface of semiconductor device 100. An annealing procedure may be performed to form a metal-silicide layer (not shown) over the surface of control gate electrodes 150. The metal-silicide may also be formed over the portion of source/drain regions 220 and 230 not covered by spacers 610. Unreacted metal may be removed from spacers 610.

Figure 7A:
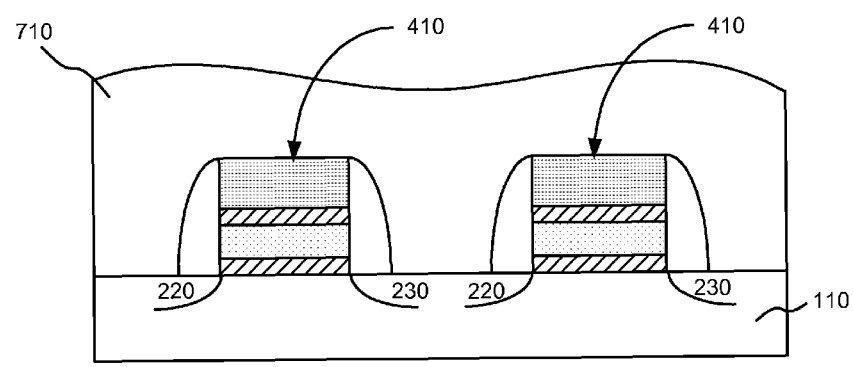
FIGS. 7A and 7B are cross-sections illustrating the formation of an interlayer dielectric on the device of FIG. 6.

A dielectric layer 710 may then be deposited over semiconductor device 100, as illustrated in FIG. 7A. Dielectric layer 710, also referred to as interlayer dielectric (ILD) 710, may include, for example, an oxide (e.g., $SiO_2$), a borophosphosilicate glass (BPSG) material or a phosphosilicate glass (PSG) material. Dielectric layer 710 may have a thickness ranging from about 6,000 Å to about 10,000 Å.

Figure 7B:
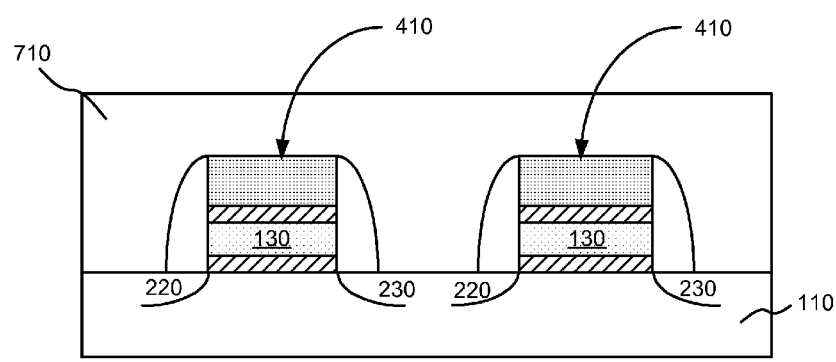

ILD 710 may optionally be planarized using a conventional process, such as a chemical-mechanical polishing (CMP) process, as illustrated in FIG. 7B. Referring to FIG. 7B, the CMP process may planarize the top surface of ILD 710 to facilitate formation of subsequent structures, such as interconnect lines. In one implementation, ILD 710 may represent an ILD located closest to substrate 110. In another implementation, ILD 710 may represent an interlayer dielectric formed a number of layers above the surface of substrate 110. In each case, ILD 710 may function to isolate various conductive structures, such as various interconnect lines described below or to isolate source region 220 or drain region 230 from other conductive structures.

Figure 8A:
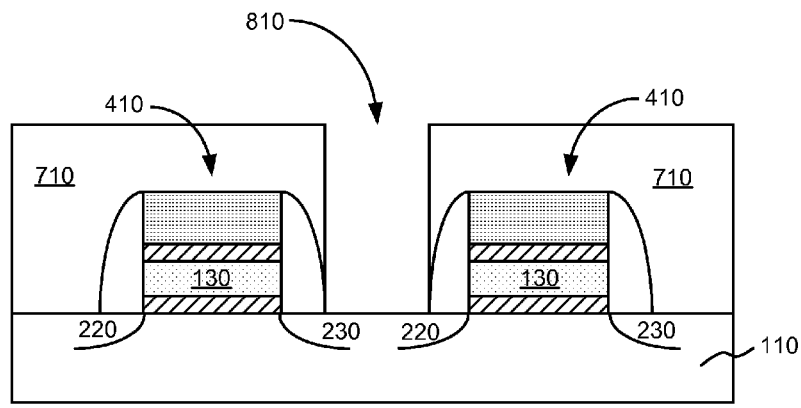
FIGS. 8A and 8B are cross-sections illustrating the formation of an exemplary contact in the interlayer dielectric of FIG. 7B.

A trench 810, which may be referred to as contact hole 810, may be formed in ILD 710 using conventional photolithographic and etching techniques, as illustrated in FIG. 8A. Contact hole 810 may form a contact to a source region (e.g., source region 220) and/or a drain region (e.g., drain region 230) of memory cells 410.

Figure 8B:
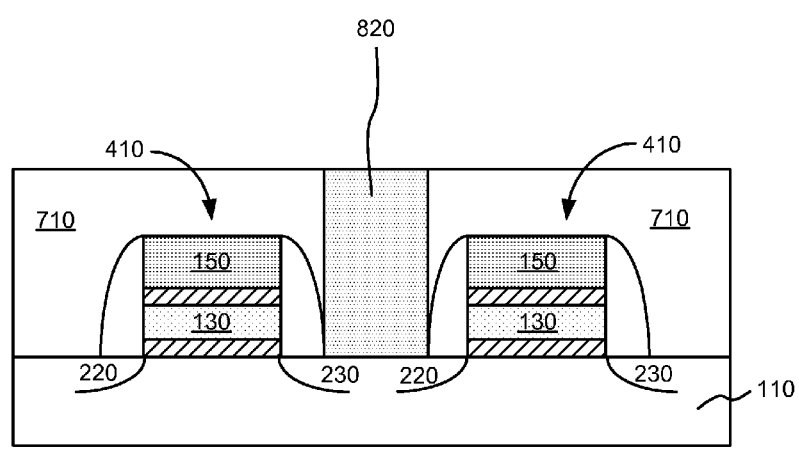

A metal layer (e.g., tungsten, copper, or aluminum) may be deposited to fill contact hole 810 to form a contact 820, as illustrated in FIG. 8B. Contact 820 may represent a contact to, for example, drain region 230 of a memory cell (e.g., memory cell 410 located on the left side of FIG. 8B) and to source region 220 of an adjacent memory cell (e.g., memory cell 410 located on the right side of FIG. 8B). Drain region 230 of the left memory cell 410 in FIG. 8B and source region 220 of the adjacent memory cell 410 in FIG. 8B may be coupled together to form a bit line. The bit line may be coupled to a column of memory cells 410 (not shown) in a memory cell array. Contact 820 may apply programming and/or erasing voltages to the bit line associated with a column of memory cells 410 depending upon the particular circuit requirements. Although only one contact 820 is illustrated in FIG. 8B, semiconductor device 100 may include multiple contacts 820 that may apply voltages to bit lines and/or word lines in semiconductor device 100.

Figure 9:
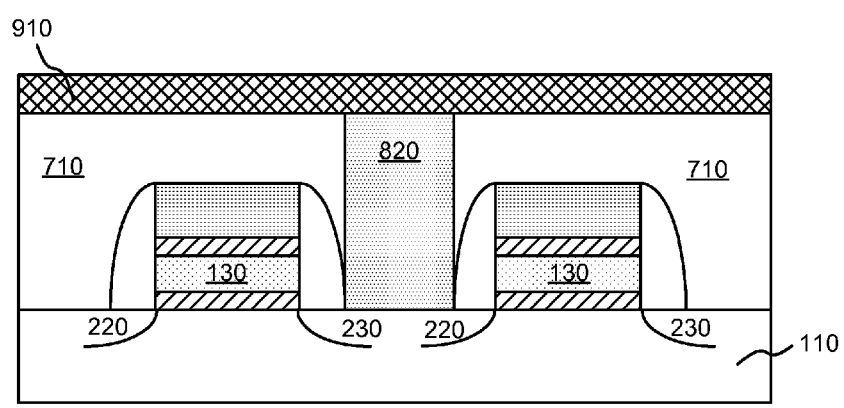
FIG. 9 is a cross-section illustrating the formation of a conductive layer on the device of FIG. 8B.

Excess portions of the metal used to form contact 820 may form over portions of dielectric layer 710. Such excess portions of metal may be removed in one implementation by a planarization process (e.g., a CMP process). A conductive interconnect line 910 may be formed over the planarized top surfaces of ILD 710 and contact 820, as shown in FIG. 9. For example, a metal (e.g., tungsten, copper or aluminum) may be deposited to form conductive line 910. In one implementation, conductive line 910 may connect various features in semiconductor device 100 (e.g., source region 220 and/or drain region 230), through contact 820, to an external electrode (not shown). In another implementation, conductive line 910 may connect various memory cells 410 in semiconductor device 100. Conductive line 910 may facilitate programming or erasing various memory cells 410 in semiconductor device 100.

Figure 10:
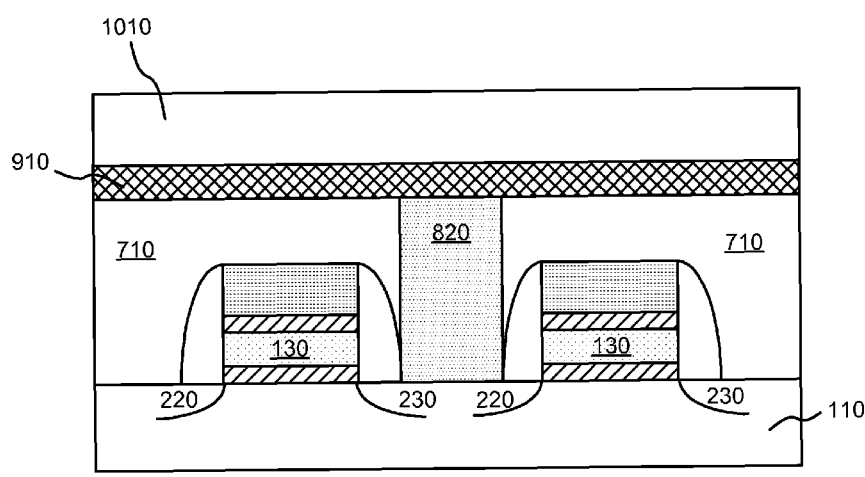
FIG. 10 is a cross-section illustrating the formation of an interlayer dielectric on the device of FIG. 9.

An ILD 1010 may be formed over conductive line 910, as illustrated in FIG. 10. In one implementation, ILD 1010 may include, for example, an oxide, a PSG, a BPSG material or another dielectric material. ILD 1010 may have a thickness ranging from about 2,500 Å to about 3,500 Å.

Figure 11:
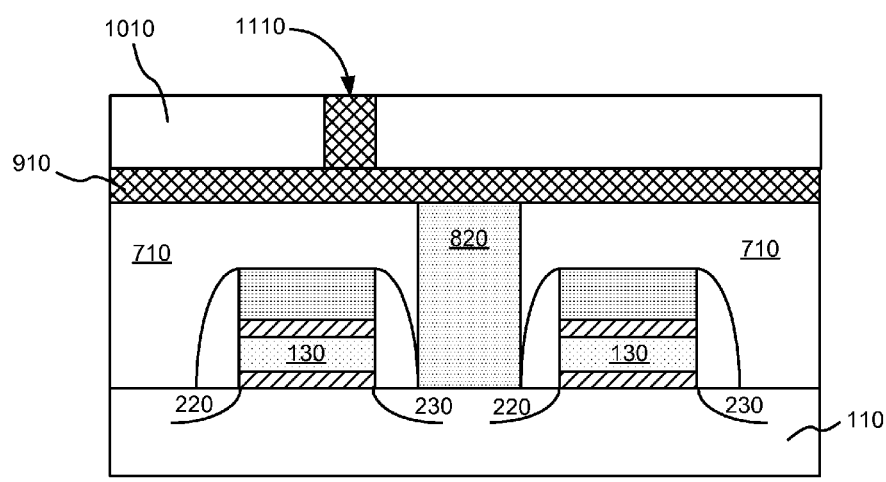
FIG. 11 is a cross-section illustrating the formation of a via in the interlayer dielectric of FIG. 10.

Various back end of line (BEOL) processing may be performed to complete the fabrication of semiconductor device 100. For example, a trench may be formed in ILD 1010 followed by deposition of a metal layer (e.g., copper, aluminum or tungsten) to form a via 1110, as illustrated in FIG. 11. Via 1110 may represent a connection to an uppermost conductive layer of semiconductor device 100. Alternatively, via 1110 may represent a connection to any one of a number of conductive layers in semiconductor device 100.

Figure 12:
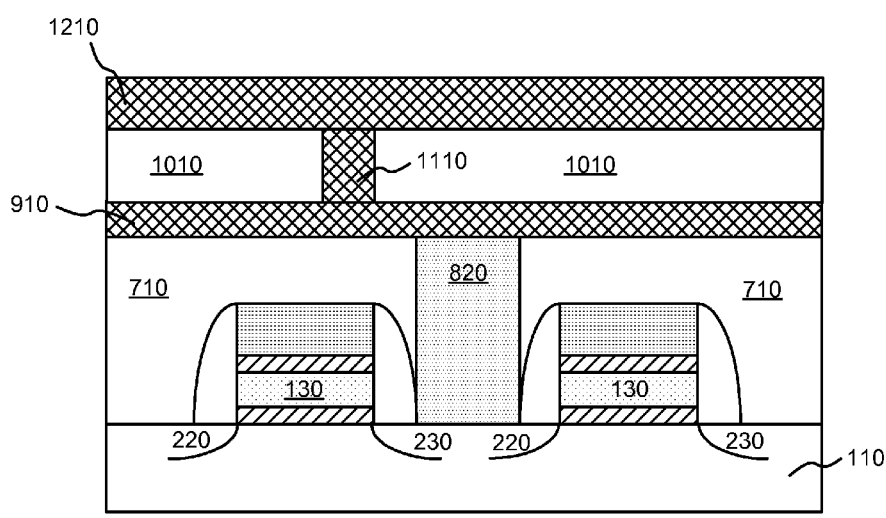
FIG. 12 is a cross-section illustrating the formation of a conductive layer on the device of FIG. 11.

A conductive layer may then be formed over ILD 1010. For example, a metal (e.g., copper or aluminum) may be deposited to form conductive line 1210, as illustrated in FIG. 12. Conductive line 1210 may represent a BEOL structure or connector that may connect various features in semiconductor device 100 (e.g., source and/or drain regions 220/230 to an external electrode (not shown)) to facilitate programming or erasing of various memory cells 410 in semiconductor device 100.

Figure 13:
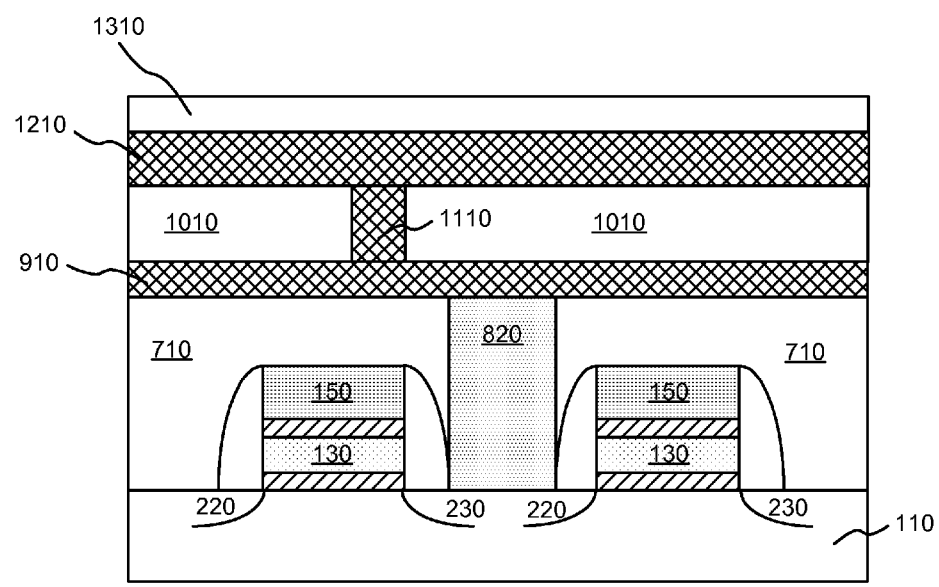
FIG. 13 is a cross-section illustrating the formation of a dielectric layer on the device of FIG. 12.

A top dielectric layer 1310, also referred to as a cap layer 1310, may be formed over conductive line 1210, as shown in FIG. 13. In one implementation, cap layer 1310 may be deposited to a thickness ranging from about 6,000 Å to about 10,000 Å. Cap layer 1310 may act as a protective layer to prevent damage to conductive line 1210 and other portions of semiconductor device 100 during subsequent processing. For example, cap layer 1310 may protect semiconductor device 100 against impurity contamination during subsequent cleaning processes that may be used to complete a working memory device.

While only two ILDs (i.e., ILDs 710 and 1010) and two conductive layers (i.e., layers 910 and 1110) are illustrated in FIG. 13 for simplicity, semiconductor device 100 may include more or less ILD layers and conductive layers based on the particular circuit requirements.

As described above, in one implementation, semiconductor device 100 illustrated in FIG. 13 may be a SONOS type memory device, with nitride layer 130 acting as a charge storage element for each memory cell 410. Each memory cell 410 may be an EEPROM type memory device and one or more programming circuits (not shown) may facilitate programming and erasing of one or more memory cells 410 of semiconductor device 100. Programming of each memory cell 410 may be accomplished by applying a voltage to its control gate 150. Once programmed, electrons remain trapped in nitride layer 130 until an erase procedure is performed.

In an implementation consistent with principles of the invention, each memory cell 410 may be configured to store two or more bits of data. For example, charge storage layer 130 for each memory cell 410 may be programmed to store charges representing two separate bits of data by localizing the first and second charges to the respective left and right sides of charge storage layer 130 illustrated in FIG. 13. Each of the two bits of memory cell 410 may be programmed independently (e.g., by channel hot electron injection) to store charges representing a bit on each respective side of the charge storage layer 130. In this manner, the charges in charge storage layer 130 may become effectively trapped on each respective side of charge storage layer 130. Erasing of each bit in memory cell 410 may also be performed independently. During erasing, the charges stored in charge storage layer 130 may tunnel through dielectric layer 120 into source region 220 and drain region 230, respectively. In another implementation, charge storage layer 130 for each memory cell 410 may be configured to store charges representing three or more bits of data by localizing the charges in charge storage layer 130.

In an alternative implementation, each memory cell 410 may be configured to store a charge representing one bit of data per memory cell 410. In addition, in alternative implementations, semiconductor device 100 may be a floating gate memory device in which layer 130 is formed from a conductive material (e.g., polysilicon) that functions as a charge storage element for each memory cell 410.

Exemplary Processes

Figure 14A:
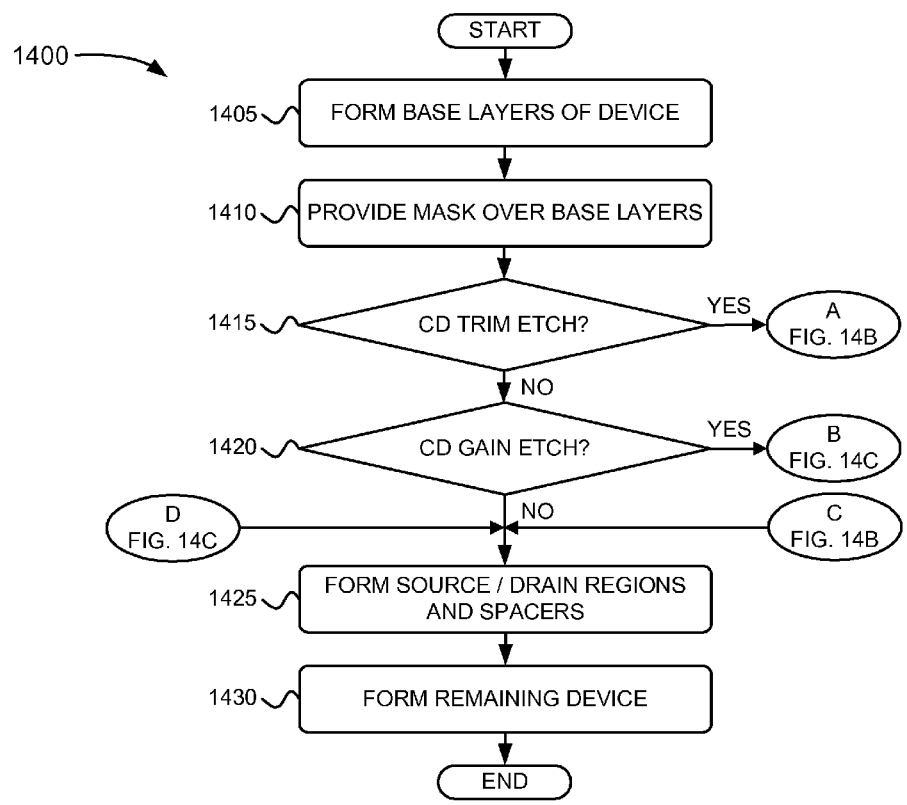
FIGS. 14A-14C show a flowchart of an exemplary process according to an implementation consistent with principles of the invention.
Figure 14B:
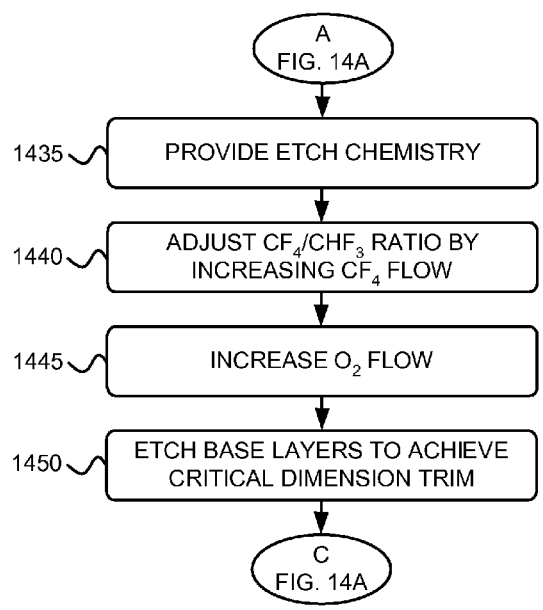
Figure 14C:
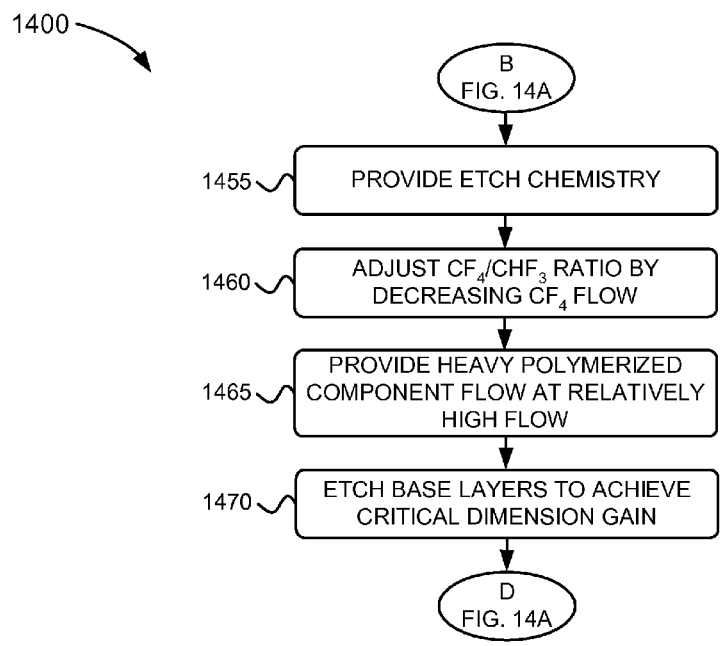

FIGS. 14A-14C show a flowchart of an exemplary process or method according to an implementation consistent with principles of the invention. The process of FIG. 14A may generally be described as overall semiconductor device formation. The process of FIG. 14B may generally be described as hard mask trim etch. The process of FIG. 14C may generally be described as hard mask gain etch.

Overall Semiconductor Device Formation Process

As shown in FIG. 14A, a process 1400 may form base layers of a semiconductor device (block 1405). For example, in one implementation described above in connection with FIG. 1, semiconductor device 100 may be formed from base layers that include substrate layer 110, first dielectric layer 120 formed on substrate layer 110, charge storage layer 130 formed on first dielectric layer 120, second dielectric layer 140 formed on charge storage layer 130, conductive layer 150 formed on second dielectric layer 140, hard mask layer 160 formed on conductive layer 150, and BARC layer 170 formed on hard mask layer 160. Process 1400 may provide a mask over the base layers of the semiconductor device (block 1410). For example, in one implementation described above in connection with FIG. 1, a photoresist material may be patterned and etched to form masks 180 on the top surface of BARC layer 170.

As further shown in FIG. 14A, process 1400 may determine whether a critical dimension trim etch (block 1415) or a critical dimension gain etch (block 1420) may be performed. If a critical dimension trim etch is to be performed (block 1415—YES), then process 1400 may perform the process blocks set forth in FIG. 14B. For example, in one implementation described above in connection with FIG. 2, layers 120-170 may be etched, and the etching may terminate at substrate 110 and form memory cells 210. If a critical dimension gain tech is to be performed (block 1420—YES), then process 1400 may perform the process blocks set forth in FIG. 14C. For example, in one implementation described above in connection with FIG. 4, layers 120-170 may be etched, and the etching may terminate at substrate 110 and form memory cells 410.

After the critical dimension trim etch (FIG. 14B) or the critical dimension gain etch (FIG. 14C), process 1400 may form source and drain regions and spacers in the semiconductor device (block 1425). For example, in one implementation described above in connection with FIG. 2, source regions 220 and drain regions 230 may be formed in substrate 110. For example, n-type or p-type impurities may be implanted in substrate 110 to form source regions 220 and drain regions 230, based on the particular end device requirements. In one implementation described above in connection with FIG. 6, spacers 610 may be formed adjacent the sidewalls of the memory cells 410. Spacers 610 may electrically isolate adjacent memory cells 410 from each other. Spacers 610 may also facilitate the deposition of impurities in semiconductor device 100.

As shown in FIG. 14A, process 1400 may form the remaining semiconductor device (block 1430). For example, in one implementation described above in connection with FIGS. 7A-13, ILD 710 may be deposited over semiconductor device 100 (FIG. 7A) and may optionally be planarized (FIG. 7B). Contact hole 810 may be formed in ILD 710 (FIG. 8A), and contact 820 may be deposited in contact hole 810 (FIG. 8B). Conductive interconnect line 910 may be formed over the planarized top surfaces of ILD 710 and contact 820 (FIG. 9), and ILD 1010 may be formed over conductive line 910 (FIG. 10). Via 1110 may be formed in ILD 1010 (FIG. 11), conductive line 1210 may be formed over ILD 1010 and via 1110 (FIG. 12), and cap layer 1310 may be formed over conductive line 1210 (FIG. 13).

Hard Mask Trim Etch Process

If a critical dimension trim etch is to be performed (block 1415—YES), then process 1400 may perform the process blocks set forth in FIG. 14B. As shown in FIG. 14B, process 1400 may provide etch chemistry (block 1435). For example, in one implementation described above in connection with FIG. 2, an etch chemistry may include a combination of $CF_4$, $CHF_3$, $C_4F_8$, Ar, and $O_2$. Process 1400 may adjust the ratio of $CF_4$ to $CHF_3$ ("$CF_4/CHF_3$ ratio") by increasing the flow rate of $CF_4$ (block 1440). For example, in one implementation described above in connection with FIGS. 2 and 3B, the $CF_4/CHF_3$ ratio may be increased by increasing the flow rate of $CF_4$ with respect to the flow rate of $CHF_3$.

Process 1400 may increase the flow rate of oxygen (block 1445). For example, in one implementation described above in connection with FIGS. 2 and 3A, the flow rate of oxygen may be greater than typically used to etch dielectric and/or semiconductor layers. Process 1400 may etch the base layers of the semiconductor device to achieve a critical dimension trim (block 1450). For example, in one implementation described above in connection with FIG. 2, the high oxygen and $CF_4$ flow rates may etch or trim BARC layer 170, as well as layers 120-160, to create memory cells 210 having a critical dimension (e.g., a width $W_1$).

Hard Mask Gain Etch Process

If a critical dimension gain etch is to be performed (block 1420—YES), then process 1400 may perform the process blocks set forth in FIG. 14C. As shown in FIG. 14C, process 1400 may provide etch chemistry (block 1455). For example, in one implementation described above in connection with FIG. 4, an etch chemistry may include a combination of $CF_4$, $CHF_3$, Ar, and a heavy polymerized component. Process 1400 may adjust the ratio of $CF_4$ to $CHF_3$ ("$CF_4/CHF_3$ ratio") by decreasing the flow rate of tetrafluoromethane (block 1460). For example, in one implementation described above in connection with FIGS. 4 and 5B, the $CF_4/CHF_3$ ratio may be decreased by decreasing the flow rate of $CF_4$ with respect to the flow rate of $CHF_3$.

Process 1400 may provide the heavy polymerized component at a relatively high flow rate (block 1465). For example, in one implementation described above in connection with FIG. 4, a relatively high flow rate of a heavy polymerized component (e.g., $C_4F_8$, $C_4F_6$, $C_4F_5$, or a combination of heavy polymerized components).

Process 1400 may etch the base layers of the semiconductor device to achieve a critical dimension gain (block 1470). For example, in one implementation described above in connection with FIG. 4, the low $CF_4$ flow rate may decrease the $CF_4/CHF_3$ ratio. This decreased $CF_4/CHF_3$ ratio may minimize erosion of masks 180, which may minimize etching of layers below masks (e.g., layers 120-170). The high heavy polymerized component flow rate may generate more polymer and provide a higher critical dimension gain for memory cells 410. Such flow rates and etch chemistry enable semiconductor device 100 to achieve the desired critical dimensions for memory cells 410.

CONCLUSION

Implementations consistent with principles of the invention may relate to hard mask etch methods to achieve the desired critical dimensions for memory cells used in memory devices. By using a hard mask and adjusting the flow rates of the etch chemistry, memory cells with small critical dimensions may be fabricated. The hard mask etching methods may also provide for improved control over the small critical dimensions of the memory cells. For example, in one implementation, the hard mask methods may be used to fabricate memory cells having critical dimensions of 65 and/or 45 nanometers (nm), and lower.

The foregoing description of preferred embodiments of the present invention provides illustrations and descriptions, but is not intended to be exhaustive or to limit the invention to the precise form disclosed. Modifications and variations are possible in light of the above teachings or may be acquired from practice of the invention.

For example, numerous specific details are set forth, such as specific materials, structures, chemicals, processes, etc., in order to provide a thorough understanding of the invention. However, implementations consistent with principles of the invention may be practiced without resorting to the details specifically set forth herein. In other instances, well known processing structures have not been described in detail, in order not to unnecessarily obscure the thrust of the invention.

Furthermore, while series of acts have been described with regard to FIGS. 14A-14C, the order of the acts may be modified in other implementations consistent with principles of the invention. Further, non-dependent acts may be performed in parallel.

Implementations of the invention are applicable in the manufacturing of semiconductor devices and particularly in memory devices having small design features and high circuit density. The invention is also applicable to the formation of any of various other types of semiconductor devices in which high circuit density is important, and hence, details have not been set forth in order to avoid obscuring the thrust of the invention.

It should be emphasized that the term "comprises/comprising" when used in the this specification is taken to specify the presence of stated features, integers, steps or components but does not preclude the presence or addition of one or more other features, integers, steps, components or groups thereof No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method of manufacturing a memory device, the method comprising:

forming a plurality of layers over a substrate; and providing an etch chemistry comprising tetrafluoromethane ($CF_4$), trifluoromethane ($CHF_3$), and oxygen ($O_2$) to etch the plurality of layers, where a flow rate of $CF_4$ to $CH_3$ ranges from about 70:30 to about 99.99:0.1.

2. The method of claim 1, where the tetrafluoromethane ($CF_4$) is provided at a flow rate ranging from about 70 standard cubic centimeters per minute (sccm) to about 100 sccm.

3. The method of claim 2, where the tetrafluoromethane ($CF_4$) is provided at the flow rate ranging from about 70 sccm to about 100 sccm for a period ranging from about 30 seconds to about 50 seconds.

4. The method of claim 1, where the providing an etch chemistry comprises:

providing the oxygen ($O_2$) at a flow rate ranging from about 0.1 sccm to about 50 sccm.

5. The method of claim 4, where the oxygen ($O_2$) is provided at the flow rate ranging from about 0.1 sccm to about 50 sccm for a period ranging from about 20 seconds to about 50 seconds.

6. The method of claim 1, where the memory device has a critical dimension ranging from about 25 nanometers to about 65 nanometers.

7. The method of claim 1, further comprising:

forming a hard mask over the plurality of layers.

8. The method of claim 7, where the hard mask layer comprises at least one of an oxide, nitride, or oxynitride.

9. A method of manufacturing a memory device, the method comprising:

forming a plurality of layers over a substrate; and performing an etch process to etch the plurality of layers, the etch process comprising an etch chemistry including tetrafluoromethane ($CF_4$), trifluoromethane ($CHF_3$), and at least one of octafluorocyclobutane ($C_4F_8$), hexafluorobutadiene ($C_4F_6$), or octafluorocyclopentene ($C_5F_8$), where the at least one of the $C_4F_8$, the $C_4F_6$, or the $C_5F_8$ is provided at a flow rate ranging from about 0.1 sccm to about 20 sccm.

10. The method of claim 9, where the etch chemistry includes providing the tetrafluoromethane ($CF_4$) and the trifluoromethane ($CHF_3$) at a flow rate ratio ranging from about 99.99:0.1 to about 50:50.

11. The method of claim 10, where the tetrafluoromethane ($CF_4$) is provided at a flow rate ranging from about 50 sccm to about 100 sccm.

12. The method of claim 11, where the tetrafluoromethane ($CF_4$) is provided at the flow rate ranging from about 50 sccm to about 100 sccm for a period ranging from about 25 seconds to about 60 seconds.

13. The method of claim 9, where the octafluorocyclobutane ($C_4F_8$), the hexafluorobutadiene ($C_4F_6$), or the octafluorocyclopentene ($C_5F_8$) is provided at the flow rate ranging from about 0.1 sccm to about 20 sccm for a period ranging from about 25 seconds to about 60 seconds.

14. The method of claim 9, further comprising:

forming a hard mask over the plurality of layers.

15. The method of claim 14, where the hard mask layer comprises at least one of an oxide, nitride, or oxynitride.

16. The method of claim 9, where the memory device has a critical dimension ranging from about 80 nanometers to about 150 nanometers.

17. A method of forming a memory device, the method comprising:

forming a plurality of layers over a substrate; and performing an etch process to etch the plurality of layers, the etch process comprising an etch chemistry including tetrafluoromethane ($CF_4$) and trifluoromethane ($CHF_3$) at a flow rate ratio ranging from about 70:30 to about 99.99:0.1, and at least one of octafluorocyclobutane ($C_4F_8$), hexafluorobutadiene ($C_4F_6$), or octafluorocyclopentene ($C_5F_8$), where at least one of the $C_4F_8$, the $C_4F_6$, or the $C_5F_8$ is provided at a flow rate ranging from about 0.1 sccm to about 20 sccm.

* * * * *